(12) United States Patent
Wloczysiak (10) Patent No.: US 9,088,298 B2
(45) Date of Patent: Jul. 21, 2015

(54) MIXED MODE TIME INTERLEAVED DIGITAL-TO-ANALOG CONVERTER FOR RADIO-FREQUENCY APPLICATIONS

(71) Applicant: SKYWORKS SOLUTIONS, INC., Woburn, MA (US)

(72) Inventor: Stephane Richard Marie Wloczysiak, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/266,844

(22) Filed: May 1, 2014

(65) Prior Publication Data

US 2014/0327561 A1   Nov. 6, 2014

Related U.S. Application Data

(60) Provisional application No. 61/818,788, filed on May 2, 2013.

(51) Int. Cl.
*H03M 1/66* (2006.01)
*H04B 14/00* (2006.01)

(52) U.S. Cl.
CPC ............... *H03M 1/66* (2013.01); *H04B 14/002* (2013.01); *H03M 1/662* (2013.01)

(58) Field of Classification Search
CPC ......... H03M 1/662; H03M 1/12; H03M 1/66; H03M 1/70; H03M 3/358; H03M 3/372; H03M 3/506; H03M 1/1215; H03M 1/661; H03M 7/3006
USPC .................................. 341/141, 142, 118, 120
See application file for complete search history.

(56) References Cited

U.S. PATENT DOCUMENTS

| | | | |
|---|---|---|---|
| 5,815,046 A | 9/1998 | Spilker, Jr. et al. | |
| 6,259,253 B1 * | 7/2001 | Ellingson | 324/322 |
| 6,356,224 B1 * | 3/2002 | Wohlfarth | 341/147 |
| 7,199,741 B2 * | 4/2007 | Clara et al. | 341/144 |
| 7,221,300 B2 | 5/2007 | Fontaine et al. | |
| 7,504,976 B1 | 3/2009 | Pellon | |
| 7,796,971 B2 | 9/2010 | Li et al. | |
| 8,502,720 B1 | 8/2013 | Wyville | |
| 8,618,969 B2 | 12/2013 | Wyville | |
| 8,659,453 B1 * | 2/2014 | Low et al. | 341/110 |

(Continued)

OTHER PUBLICATIONS

K. Poulton et al., A 7.2-GSa/s, 14-bit or 12-GSa/s, 12-bit DAC in a 165-GHz fT BiCMOS Process, 2011 Symposium on VLSI Circuits Digest of Technical Papers.
S. Balasubramanian et al., Systematic Analysis of Interleaved Digital-to-Analog Converters, IEEE Transactions on Circuits and Systems—II: Express Briefs, vol. 58, No. 12, Dec. 2011.

(Continued)

*Primary Examiner* — Linh Nguyen
(74) *Attorney, Agent, or Firm* — Fernando Hale & Chang LLP (57) ABSTRACT

Disclosed are systems, devices and methods related to mixed mode time interleaved digital-to-analog converters (DACs). In some embodiments, such DACs can be utilized for radio-frequency (RF) applications. In some embodiments, a DAC for RF applications can include a first circuit configured to receive a digital signal and perform a first operation to yield an increased bandwidth of the DAC. The DAC can further include a second circuit configured to perform a second operation on the digital signal to yield an analog signal representative of the digital signal. The second circuit can be further configured to reduce or remove an image within the increased bandwidth.

16 Claims, 11 Drawing Sheets

(56) References Cited

U.S. PATENT DOCUMENTS

| | | | |
|---|---|---|---|
| 8,711,288 B2* | 4/2014 | Vorenkamp et al. | 348/725 |
| 2001/0052864 A1* | 12/2001 | Shimizu et al. | 341/141 |
| 2004/0141569 A1* | 7/2004 | Agazzi | 375/302 |
| 2004/0240584 A1* | 12/2004 | Meade et al. | 375/297 |
| 2005/0258992 A1* | 11/2005 | Fontaine et al. | 341/144 |
| 2007/0146186 A1 | 6/2007 | Jungerman | |
| 2009/0052556 A1 | 2/2009 | Fernandez | |
| 2010/0098191 A1 | 4/2010 | Morris et al. | |
| 2011/0075780 A1* | 3/2011 | Petrovic | 375/355 |
| 2011/0282924 A1* | 11/2011 | Mallinson | 708/3 |
| 2012/0106316 A1* | 5/2012 | Azadet | 370/201 |
| 2012/0176190 A1* | 7/2012 | Goodman et al. | 327/551 |
| 2013/0234871 A1* | 9/2013 | Eliezer et al. | 341/120 |

OTHER PUBLICATIONS

Data Sheet for Analog Devices AD9737A/AD9739A, 11-/14-Bit, 2.5 GSPS, RF Digital-to-Analog Converters.

G. Engel et al., A 14b 3/6GHz Current-Steering RF DAC in 0.18 μm CMOS with 66dB ACLR at 2.9GHz, IEEE International Solid-State Circuits Conference, Session 27, Feb. 2012.

M. Sadeghifar et al., A Survey of RF DACs, Division of Electronics Systems, Department of Electrical Engineering, Linkoping University, Sweden.

A. Jerng, A Wideband ΔΣ Digital-RF Modulator for High Data Rate Transmitters, IEEE Journal of Solid-State Circuits, vol. 42, No. 8, Aug. 2007.

A. Kuckreja et al., High-speed DACs Ease Transmitter Designs, Microwaves & RF, Aug. 2010.

* cited by examiner

MIXED MODE TIME INTERLEAVED DIGITAL-TO-ANALOG CONVERTER FOR RADIO-FREQUENCY APPLICATIONS

CROSS-REFERENCE TO RELATED APPLICATIONS

This application claims priority to U.S. Provisional Application No. 61/818,788 filed May 2, 2013, entitled MIXED MODE TIME INTERLEAVED DIGITAL-TO-ANALOG CONVERTER FOR RADIO-FREQUENCY APPLICATIONS, the disclosure of which is hereby expressly incorporated by reference herein in its entirety.

BACKGROUND

1. Field

The present disclosure generally relates to digital-to-analog converters (DACs) for radio-frequency (RF) applications.

2. Description of the Related Art

In many digital wireless devices and systems, data is commonly processed in digital format, and converted into an analog format for transmission. Such a conversion is typically performed by a digital-to-analog converter (DAC).

A DAC converts digital information in discrete steps into an analog representation of the information. During such conversion processes, a number of effects can be manifested; and at least some of such effects can degrade the performance of devices and systems that utilize DACs.

SUMMARY

In some implementations, the present disclosure relates to a digital-to-analog converter (DAC) that includes a first circuit configured to receive a digital signal and perform a first operation to yield an increased bandwidth of the DAC. The DAC further includes a second circuit configured to perform a second operation on the digital signal to yield an analog signal representative of the digital signal. The second circuit is further configured to reduce or remove an image within the increased bandwidth.

In some embodiments, the first circuit can include an upsampling circuit configured to upsample the digital signal by a factor of n, with the quantity n being a real number such as 2. The first circuit can further include a finite impulse response (FIR) filter configured to receive the upsampled digital signal and generate a filtered upsampled digital signal.

In some embodiments, the first circuit can further include a mixing circuit in communication with the second circuit. The mixing circuit can be configured to perform a mix mode operation. In some embodiments, the second circuit can include a time-interleaved DAC (TIDAC) circuit in communication with the mixing circuit. The TIDAC circuit can include a plurality of sample-and-hold (S/H) circuits. Each S/H circuit can be configured to receive the upsampled digital signal and generate a converted analog signal. The TIDAC circuit can include a clock in communication with the plurality of S/H circuits. The clock can be configured to provide interleaved clock signals to the plurality of S/H circuits. The TIDAC circuit can further include a delay circuit configured to provide a delay for at least one of the interleaved clock signals.

In some embodiments, the mix mode operation can be performed in analog domain. The mixing circuit can include a multiplier circuit in communication with each of the plurality of S/H circuits. Each multiplier circuit can be configured to receive the converted analog signal from its respective S/H circuit and a mixing clock signal. Each multiplier circuit can be further configured to generate a product signal based on the converted analog signal and the mixing clock signal. The first circuit can further include a summing circuit in communication with each of the plurality of multiplier circuits. The summing circuit can be configured to receive the product signals from their respective multiplier circuits and generate an analog output signal for the DAC.

In some embodiments, the mix mode operation can be performed in digital domain. The mixing circuit can include a multiplier circuit in communication with an input of each of the plurality of S/H circuits. The multiplier circuit can be configured to receive the upsampled digital signal and a mixing clock signal. The multiplier circuit can be further configured to generate a product signal for the plurality of S/H circuits based on the upsampled digital signal and the mixing clock signal. The first circuit can further include a switching circuit in communication with an output of each of the plurality of S/H circuits. The switching circuit can be configured to receive the converted analog signal from each of the plurality of S/H circuits and a clock signal. The switching circuit can be further configured to generate an analog output signal for the DAC circuit. The clock signal provided to the switching circuit can be provided from the clock of the TIDAC that provides the interleaved clock signals to the plurality of S/H circuits.

In some embodiments, the analog signal can include a radio-frequency (RF) signal. The image can include a spurious emission peak.

In some embodiments, the increased bandwidth can have a broader effective frequency range than a sinc response function. The increased bandwidth can have a broader effective frequency range than a response obtained by a mix mode operation alone.

In accordance with a number of implementations, the present disclosure relates to a method for converting a digital signal to a radio-frequency (RF) signal. The method includes receiving the digital signal and performing a first operation to yield an increased bandwidth of the RF signal. The method further includes performing a second operation on the digital signal to yield the RF signal. The second operation further reduces or removes an image within the increased bandwidth.

In some embodiments, the first operation can include upsampling of the digital data. The first operation can further include filtering of the upsampled digital data.

In some embodiments, the operation can further include a mixing operation. The mixing operation can be performed in digital domain or in analog domain. The second operation can include performing a plurality of time-interleaved digital-to-analog conversion (TIDAC) operations on the upsampled digital data. The second operation can further include combining, or selecting one of, outputs of the TIDAC operations.

In a number of teachings, the present disclosure relates to a baseband sub-system that includes a processor configured to generate a digital signal, and a digital-to-analog converter (DAC) configured to convert the digital signal into a radio-frequency (RF) signal. The DAC includes a first circuit configured to receive the digital signal and perform a first operation to yield an increased bandwidth of the DAC. The DAC further includes a second circuit configured to perform a second operation on the digital signal to yield the RF signal representative of the digital signal. The second operation is further configured to reduce or remove an image within the increased bandwidth.

According to some implementations, the present disclosure relates to a wireless system that includes a baseband sub-system configured to process a digital signal. The baseband sub-system has a digital-to-analog converter (DAC) that includes a first circuit configured to receive the digital signal and perform a first operation to yield an increased bandwidth of the DAC. The DAC further includes a second circuit configured to perform a second operation on the digital signal to yield a radio-frequency (RF) signal representative of the digital signal. The second circuit is further configured to reduce or remove an image within the increased bandwidth. The wireless system further includes an RF sub-system in communication with the baseband sub-system. The RF sub-system is configured to receive the RF signal and generate an amplified RF signal. The wireless system further includes an antenna in communication with the RF sub-system. The antenna is configured to facilitate transmission of the amplified RF signal.

In some embodiments, the wireless system can be implemented in an infrastructure base station. The wireless system can be implemented in a portable wireless device such as a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed herein are various systems, circuits, devices and methods related to digital-to-analog conversion of signals for radio-frequency (RF) applications. Although described in the context of RF applications, it will be understood that one or more features of the present disclosure can also be utilized in other applications involving digital-to-analog conversions.

When synthesizing a signal from a digital format to an RF format, a problem that can arise is a limitation in bandwidth of a digital-to-analog converter (DAC). In some situations, such a limitation in bandwidth can include a band limited frequency response of the DAC due to the Nyquist bandwidth Fs/2, where Fs represents a sampling frequency. Such band limitation can have an effect of reducing the dynamic range of an RF system. Such band limitation can also result in complications associated with replication of a signal in the frequency domain for Fs that creates a spurious emission close to the transmitted signal when operating close to Fs/2.

Figure 1:
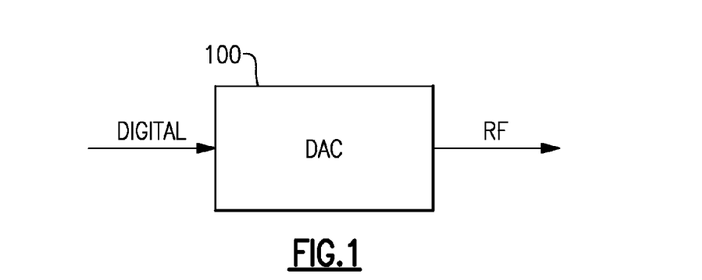
FIG. 1 depicts a digital-to-analog converter (DAC) having one or more features as described herein.

FIG. 1 schematically depicts a DAC 100 having one or more features as described herein. Such features can advantageously address some or all of the foregoing problems associated with DACs utilized in RF applications. As depicted in FIG. 1, the DAC 100 can be configured to receive a digital signal and generate an RF signal representative of the digital signal. Examples of the DAC 100 are described herein in greater detail.

Figure 2:
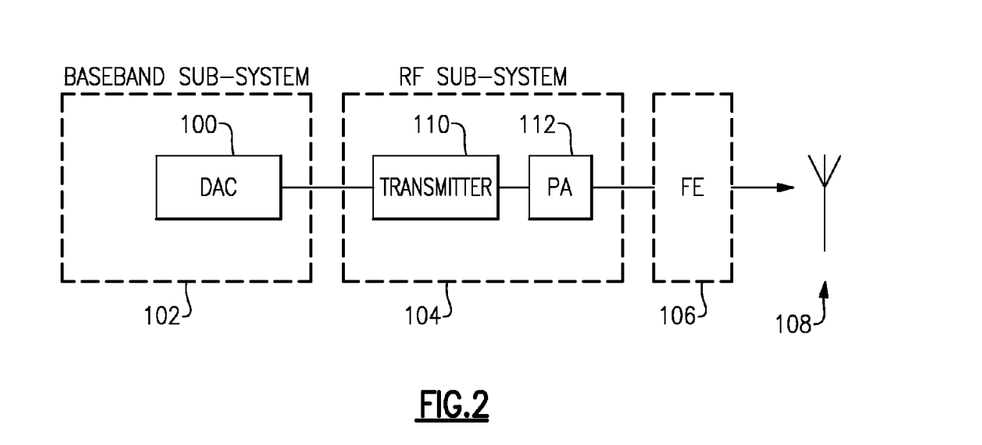
FIG. 2 shows that in some embodiments, the DAC of FIG. 1 can be implemented in wireless systems.

FIG. 2 depicts a wireless system in which a DAC 100 having one or more features of the present disclosure can be implemented. In some embodiments, the DAC 100 can be implemented in a baseband sub-system 102 to convert a digital signal to a corresponding analog signal. Such an analog signal can be provided to a transmitter 110 that is configured to generate an RF signal to be amplified (e.g., by a power amplifier (PA) 112) for transmission. In some embodiments, the transmitter 110 and the PA 112 can be implemented in an RF sub-system 104.

FIG. 2 further shows that an amplified RF signal from the PA 112 can be provided to an antenna 108 through a front end system 106. In some embodiments, the front end system 106 can be configured to facilitate receive (Rx) (not shown) and transmit (Tx) operations.

In some embodiments, the wireless system of FIG. 2 can be implemented in a base-station, a wireless device, or any RF systems involving conversion of digital signals to analog signals. Further, although described in the example context of the DAC 100 being part of the baseband sub-system 102, it will be understood that one or more features of the present disclosure can also be implemented in other types of RF architectures.

Figure 3A:
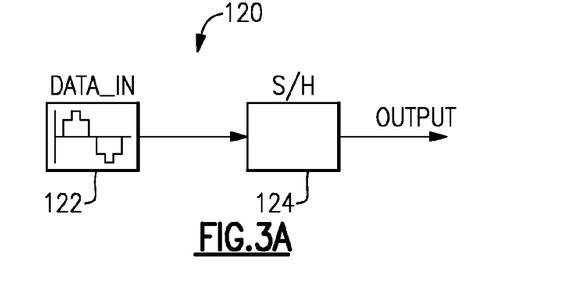
FIG. 3A shows a conventional DAC configuration.

FIG. 3A shows a conventional DAC configuration 120, where a digital signal depicted as "Data_in" 122 is provided to a sample-and-hold (S/H) circuit 124. The S/H circuit 124 can be configured and operated in known manners to yield an analog output.

As is generally understood, the foregoing conventional DAC configuration typically has a response that can be characterized or approximated by a sinc function, where $\text{sinc}(x)=\sin(x)/x$. It is also generally understood that when a DAC samples at a frequency of $F_s$ to generate a tone frequency $F_{tone}$, a spurious emission at a frequency of $F_{IM}$ can be generated. $F_{IM}$ can be expressed as $F_{IM}=F_s-F_{tone}$, and such spurious emissions are generally undesirable. Such spurious emissions are also referred to herein as images.

Figure 4A:
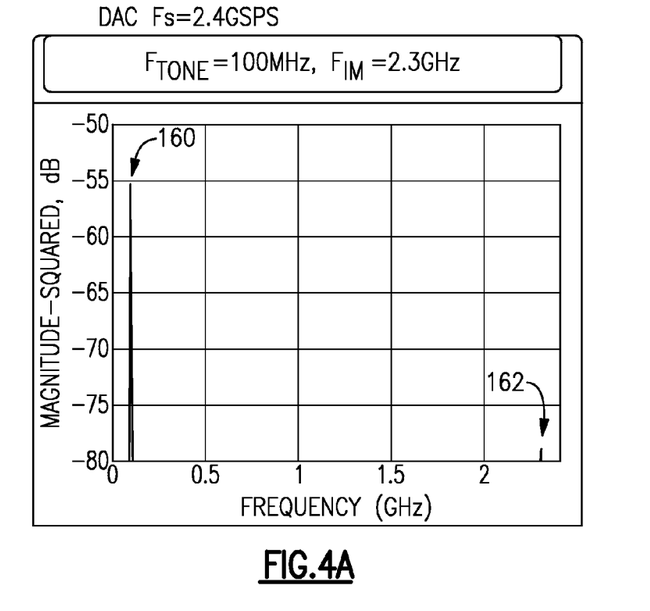
FIG. 4A shows an example response of a conventional DAC having a sampling frequency $F_s$ and a tone frequency $F_{tone}$.

FIG. 4A shows an example response of a conventional DAC (e.g., the example of FIG. 3A) operated at a sampling frequency $F_s$ of 2.4 GHz, and generating a tone frequency $F_{tone}$ of 0.1 GHz (peak 160). As shown, a spurious emission (image) peak 162 occurs at a frequency ($F_{IM}$) of approximately 2.3 GHz (2.4−0.1). In this particular example, $F_{tone}$ and $F_{IM}$ are separated significantly, and the spurious emission amplitude is substantially reduced due to the sinc function response. Accordingly, the relatively small spurious emission peak 162 can be removed relatively easily.

Figure 4B:
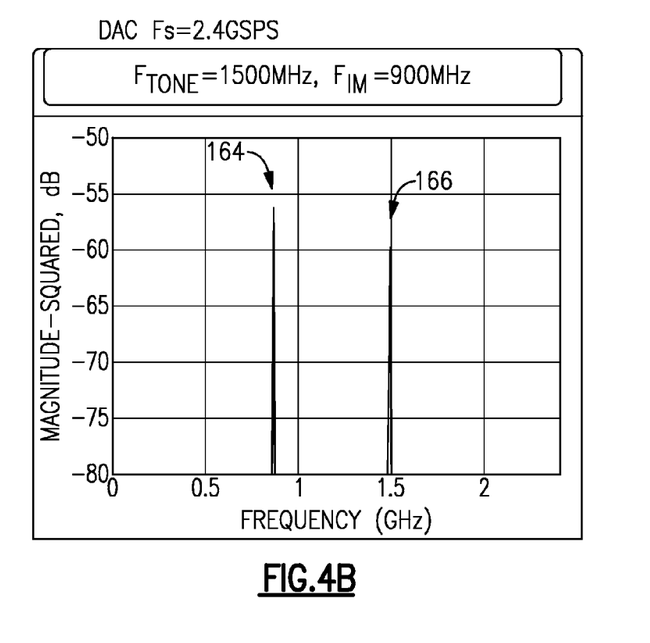
FIG. 4B shows an example DAC operating situation where a relatively large spurious emission peak can occur.

However, consider another example situation as shown in FIG. 4B, where $F_s=2.4$ GHz, and $F_{tone}=1.5$ GHz (peak 166). As shown, a relatively large spurious emission (image) peak 164 occurs at $F_{IM}$ of approximately 0.9 GHz (2.4−1.5).

Based on the foregoing examples, it is noted that as $F_{tone}$ increases, the tone power decreases, thereby reducing the dynamic range. Further, as $F_{tone}$ becomes close to $F_s/2$, $F_{IM}$ undesirably becomes close to $F_{tone}$. The frequency $F_s/2$ is sometimes referred to as Nyquist frequency. Such frequency and related effects such as aliasing are generally understood.

The foregoing effects described in reference to FIGS. 4A and 4B can be addressed in a number of ways. For example, dynamic range of a DAC system can be maintained or improved by signal equalization to compensate for the roll-off of the DAC response. Techniques such as re-sampling or upsampling the incoming data can also be utilized. In the context of upsampling, a number of operating modes can be utilized. Return-to-zero mode and mixed mode are examples of such an operating mode.

Figure 3B:
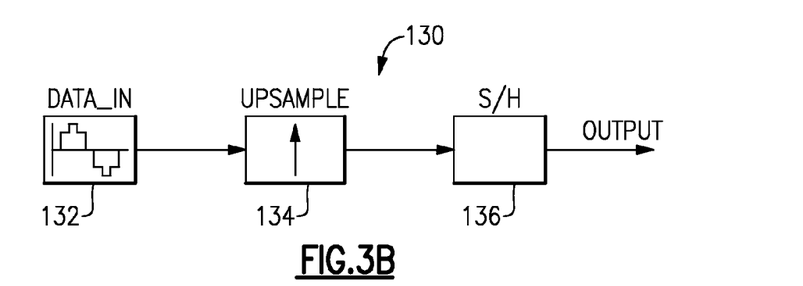
FIG. 3B shown an example of an upsampling configuration.

FIG. 3B schematically depicts an upsampling configuration 130, where a digital signal depicted as "Data_in" 132 is upsampled by an upsample component 134. If the upsampling occurs by a factor of n, the effective sampling frequency emerging from the upsample component 134 can be $nF_s$. The upsampled data is shown to be provided to a sample-and-hold (S/H) circuit 136. The S/H circuit 136 can be configured and operated in known manners to yield an analog output.

Figure 5A:
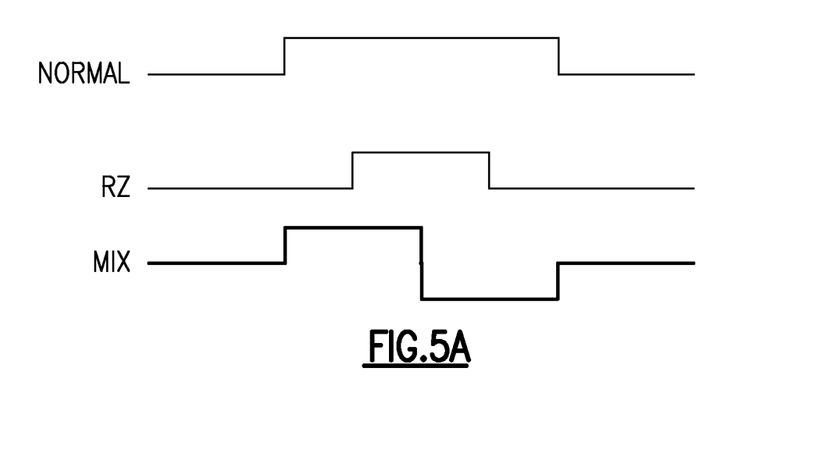
FIG. 5A shows examples of return-to-zero (RZ) and mixed (MIX) sampling modes in comparison with a normal sampling mode.
Figure 5B:
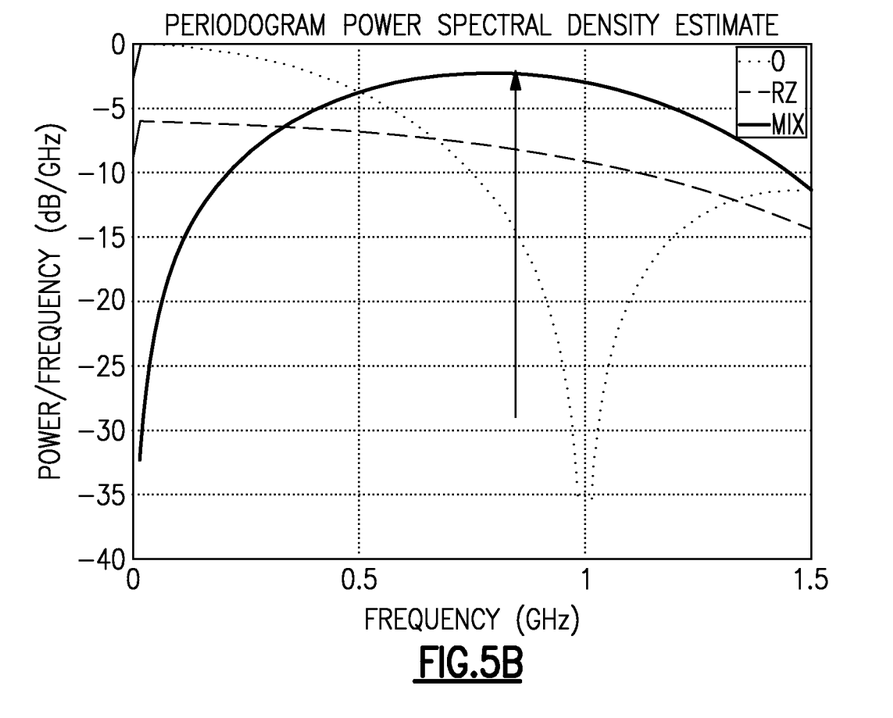
FIG. 5B shows examples of power spectral density estimates for the sampling modes of FIG. 5A.

FIGS. 5A and 5B show examples of the foregoing return-to-zero (RZ) and mixed (MIX) modes of operation (e.g., utilized in the upsampling configuration of FIG. 3B) in comparison with the conventional (Normal) DAC operation. In FIG. 5A, sampling cycles representative of the Normal, RZ, and MIX modes are depicted. FIG. 5B shows power spectral density estimates for the same modes.

In FIG. 5B, the MIX mode is shown to yield the widest bandwidth extension among the three example configurations, and the peak location of the MIX mode response is indicated by an arrow. At the frequency corresponding to such a peak, the Normal response ("603") utilizing zero-hold sampling has power that is already in a steep slope of the sinc response, even if equalization is utilized. With the RZ sampling, power drops to about −8 dBFS which can severely degrade noise spectrum and spectrum mask performance of the DAC, thereby making the response unusable for low noise spectral density (NSD) applications such as those associated with infrastructure base stations.

Figure 6A:
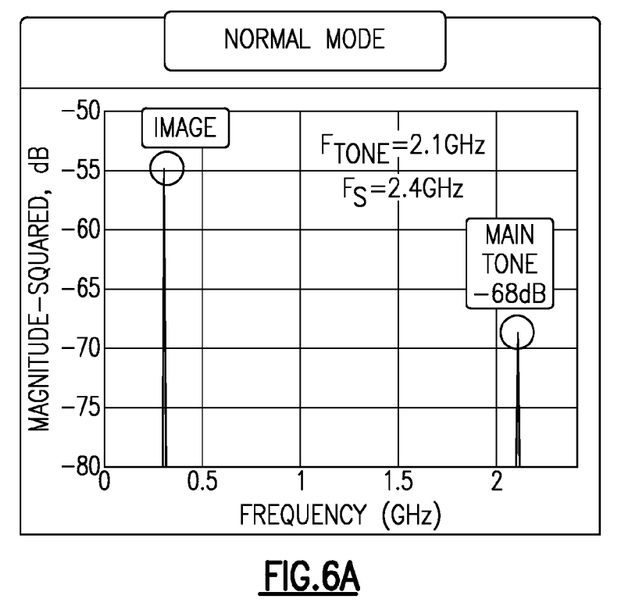
FIG. 6A shows an example normal mode operating condition where a tone frequency $F_{tone}$ of $(7/8)F_s$, with $F_s$ being 2.4 GHz, yields a relatively high amplitude spurious emission (image) at approximately 0.3 GHz.

The MIX mode, with the widest bandwidth extension among the three examples, can also have its bandwidth limited by a spurious emission (image). Such an effect is shown in reference to FIGS. 6A and 6B. FIG. 6A shows a Normal mode operating condition where a desired tone frequency $F_{tone}$ is $(7/8)F_s$, with $F_s$ being 2.4 GHz. Thus, $F_{tone}$ is approximately 2.1 GHz, and a relatively high amplitude spurious emission (image) (based on the sinc response) is shown to be generated at $F_{IM}$ of approximately 0.3 GHz.

Figure 6B:
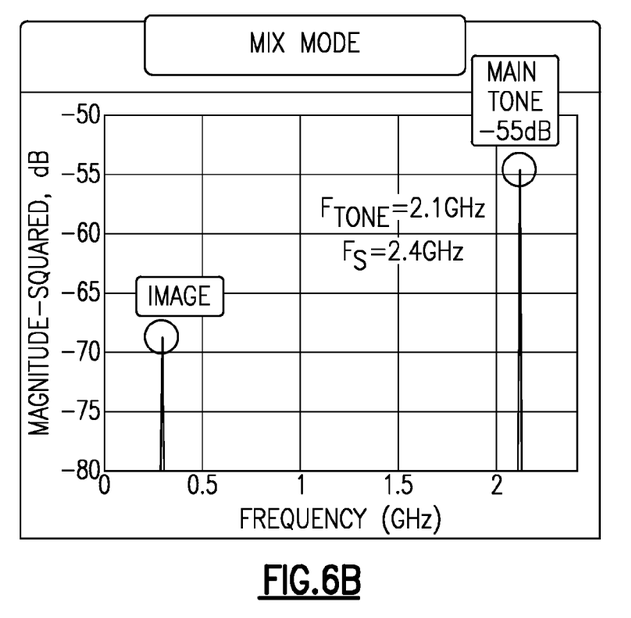
FIG. 6B shows an example mixed mode operating condition, with the same $F_{tone}$ and $F_s$ as FIG. 6A, that yields a boosted amplitude for the tone frequency $F_{tone}$, but where the spurious emission (image) amplitude can remain sufficiently high to impact the operating bandwidth.

In FIG. 6B, a MIX mode of operation with the same tone and sampling frequencies ($F_s=2.4$ GHz, $F_{tone}=(7/8)F_s=2.1$ GHz) is shown to yield a boosted amplitude (e.g., by approximately 13 dB) for the tone frequency $F_{tone}$, and a reduced amplitude for the image at $F_{IM}$ of approximately 0.3 GHz. Nevertheless, the spurious emission amplitude (image) can remain sufficiently significant to impact the operating bandwidth.

In some applications, spectrum replica such as spurious emissions (images) can be reduced by techniques such as time-interleaved DAC (TIDAC) architectures. Typically, a TIDAC configuration can include a parallel combination of a plurality of DAC channels, and outputs of such channels can be summed to produce an overall system output.

Figure 3C:
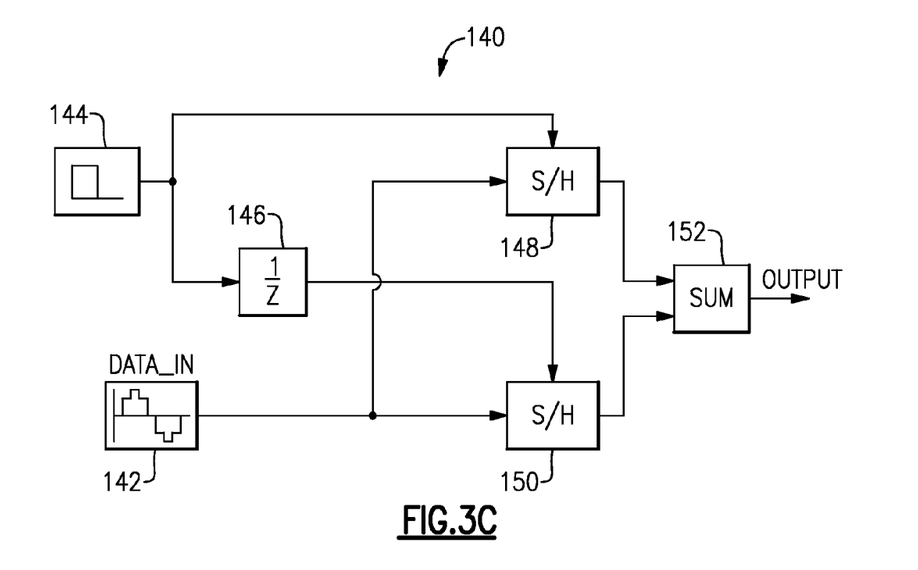
FIG. 3C shows an example of a time-interleaved DAC (TIDAC) configuration.

FIG. 3C shows an example TIDAC configuration 140 having two DAC channels. The first channel is shown to include a first sample-and-hold (S/H) component 148 that receives input data (Data_in) 142. Similarly, the second channel is shown to include a second S/H component 150 that also receives the input data (Data_in) 142. The first S/H component 148 is shown to be operated by a clock signal from a clock 144, and the second S/H component 150 is shown to be operated by a delayed (e.g., by half-cycle) version of the clock signal from the clock 144. In the example, the delay is shown to be introduced by a component 146.

Figure 7A:
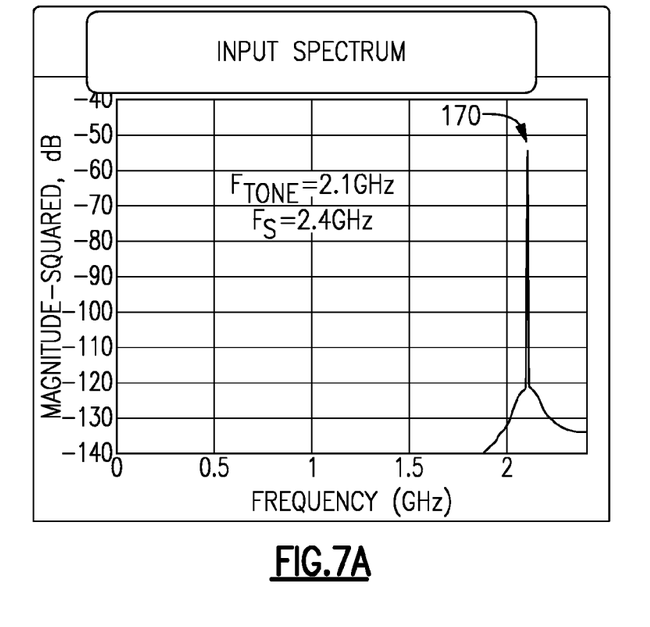
FIG. 7A shows an input spectrum of a TIDAC system operating at the same $F_{tone}$ and $F_s$ as FIG. 6A.
Figure 7B:
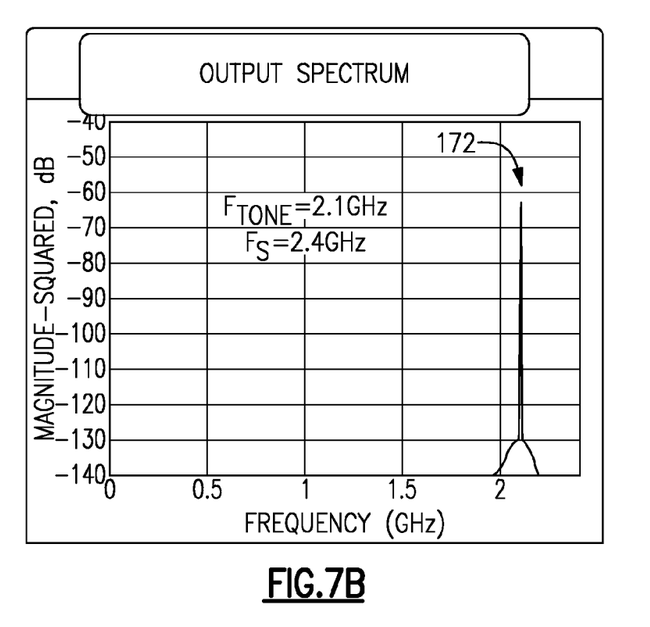
FIG. 7B shows an output spectrum of the TIDAC system of FIG. 7A, with the image substantially removed from 0.3 GHz.

FIG. 3C further shows that outputs of the first and second S/H components 148, 150 can be combined in a summing circuit 152 so as to yield an analog output. Such a TIDAC configuration can effectively remove an image resulting from spurious emission. For example, FIG. 7A shows an input spectrum of a TIDAC system operating at $F_{tone}$ of 2.1 GHz (peak 170) (with $F_s=2.4$ GHz). FIG. 7B shows an output spectrum that includes the $F_{tone}$ peak 172 at 2.1 GHz, and with the first image substantially removed at or near 0.3 GHz. While the image is effectively removed from the output spectrum, it is noted that the output power of the tone peak 172 is reduced from the input power by about 12 dB due to the sinc roll-off.

In some implementations, a DAC system can be configured to include one or more features associated with techniques for boosting the output tone power (e.g., to thereby expand the usable bandwidth), and one or more features associated with techniques for reducing or substantially removing undesirable image(s). For example, one or more features associated with a MIX mode configuration as described in reference to FIGS. 3B, 5 and 6 can be combined with one or more features associated with a TIDAC configuration described in reference to FIGS. 3C and 7. Although described in the context of such an example, it will be understood that one or more features of the present disclosure can also be implemented in other combinations.

Figure 8:
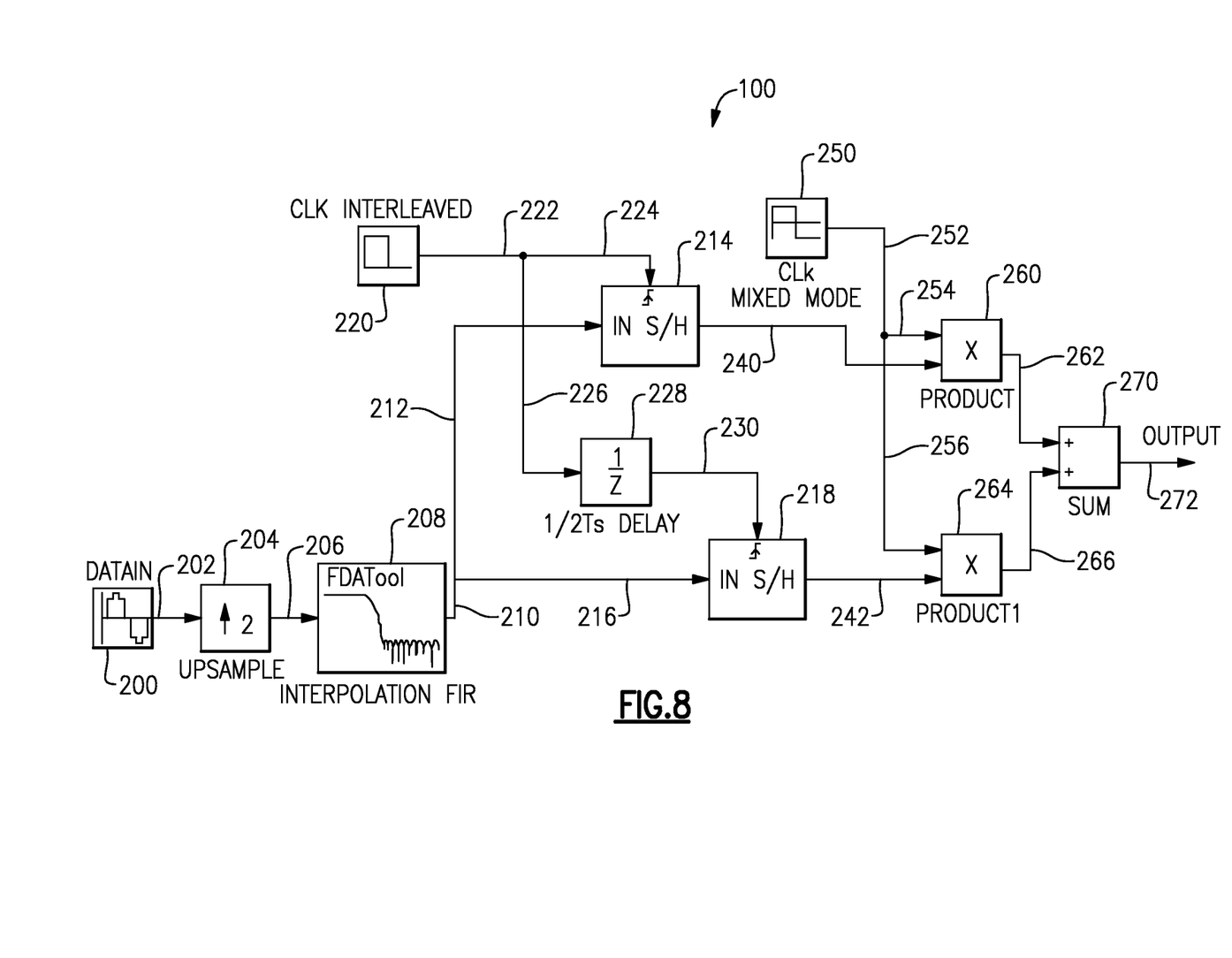
FIG. 8 shows an example DAC configuration that can be implemented to provide an output spectrum having an improved tone power and an image that is reduced or substantially removed.

FIG. 8 shows an example DAC configuration 100 that can be implemented to provide desirable features such as an output spectrum having an improved tone power and an image that is reduced or substantially removed. The DAC configuration 100 can include an upsample circuit 204 (e.g., upsample by a factor of 2) that receives an input of digital signal 200 through a path 202 so as to yield an upsampled data. Such data can be provided to a filter 208 (e.g., a finite impulse response (FIR) filter) through a path 206 to yield an upsampled and filtered data in an output path 210.

The upsampled and filtered data is shown to be provided to a first S/H circuit 214 through paths 210 and 212. Similarly, the upsampled and filtered data is shown to be also provided to a second S/H circuit 218 through paths 210 and 216. The first and second S/H circuits 214, 218 can be operated in a TIDAC mode. For example, the first S/H circuit 214 is shown to be operated by a clock signal from a clock 220 through paths 222 and 224, and the second S/H circuit 218 is shown to be operated by a delayed (e.g., by half-cycle) version of the clock signal from the clock 220 through paths 222, 226 and 230. In the example, the delay is shown to be introduced by a component 228.

In the example configuration 100 of FIG. 8, mixing operation can be performed in the analog domain. For example, each of the analog outputs of the first and second S/H circuits 214, 218 can be multiplied with a mixed mode clock signal from a clock 250. More particularly, the analog output from the first S/H circuit 214 is shown to be provided to a first multiplier circuit 260 through path 240, and the mixed mode clock signal from the clock 250 is shown to be provided to the first multiplier circuit 260 through paths 252 and 254. The first multiplier circuit 260 is shown to output a product signal to path 262. Similarly, the analog output from the second S/H circuit 218 is shown to be provided to a second multiplier circuit 264 through path 242, and the mixed mode clock signal from the clock 250 is shown to be provided to the second multiplier circuit 264 through paths 252 and 256. The second multiplier circuit 264 is shown to output a product signal to path 266.

As further shown in FIG. 8, the output signals of the first and second multiplier circuits 260, 264 are shown to be combined by a summing circuit 270. The summing circuit 270 is shown to yield an output signal to path 272 that can be utilized as an output of the DAC 100.

Figure 9A:
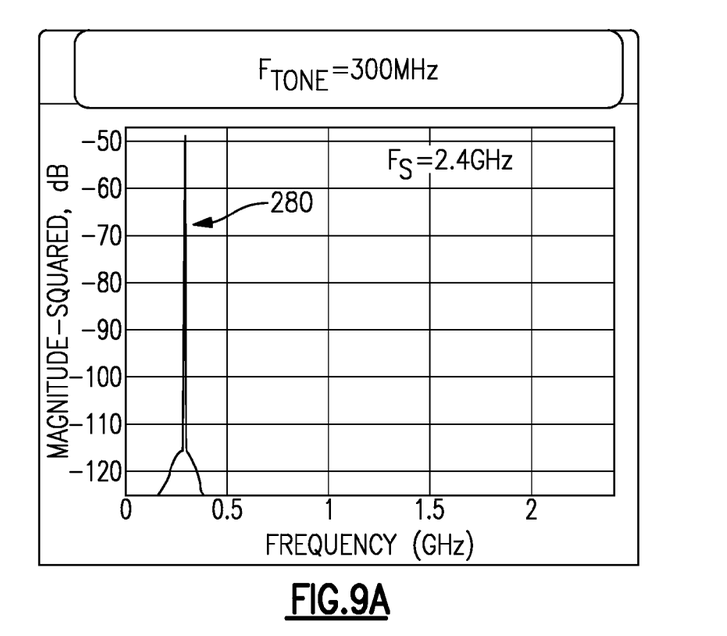
FIG. 9A shows an example of an output spectra resulting from the DAC of FIG. 8 operated at $F_s$ of 2.4 GHz and $F_{tone}$ of 0.3 GHz, where the first image is substantially absent or reduced.
Figure 9B:
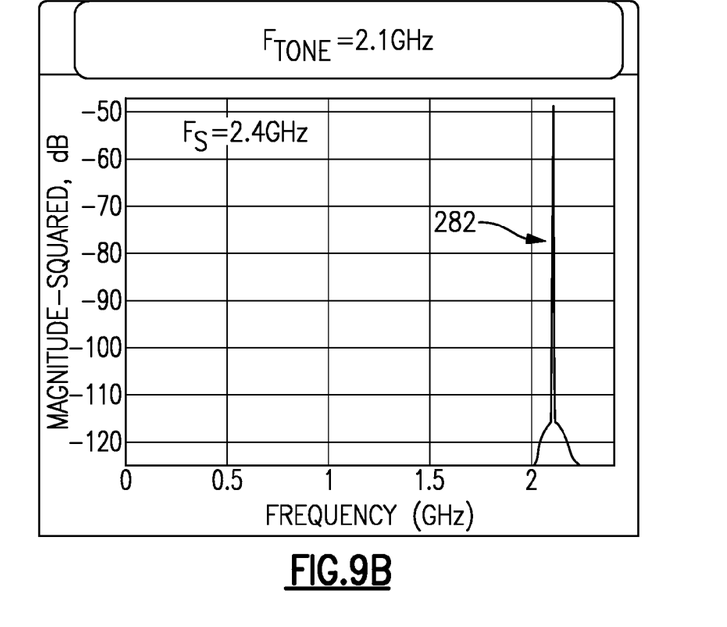
FIG. 9B shows another example of an output spectra resulting from the DAC of FIG. 8 operated at $F_s$ of 2.4 GHz and $F_{tone}$ of 2.1 GHz, where the first image is also substantially absent or reduced.

A DAC configured and operated in the foregoing manner can yield desirable functionalities, including increased bandwidth and reduction or substantial elimination of an image at least within the increased bandwidth. For example, FIGS. 9A and 9B show output spectra resulting from the DAC 100 of FIG. 8 operated at $F_s$ of 2.4 GHz, and $F_{tone}$ of 0.3 GHz (peak 280 in FIG. 9A) and 2.1 GHz (peak 282 in FIG. 9B), respectively. One can see that in each spectrum, a first image is substantially absent or reduced. More particularly, a first image at $F_{IM}$ of 2.1 GHz (2.4-0.3) is substantially absent in the spectrum of FIG. 9A; and a first image at $F_{IM}$ of 0.3 GHz (2.4-2.1) is substantially absent in the spectrum of FIG. 9B. Further, the improved bandwidth is manifested by the output powers of the 0.3 GHz tone (peak 280) and the 2.1 GHz (peak 282) tone being approximately the same (e.g., greater than about −50 dB).

Figure 10:
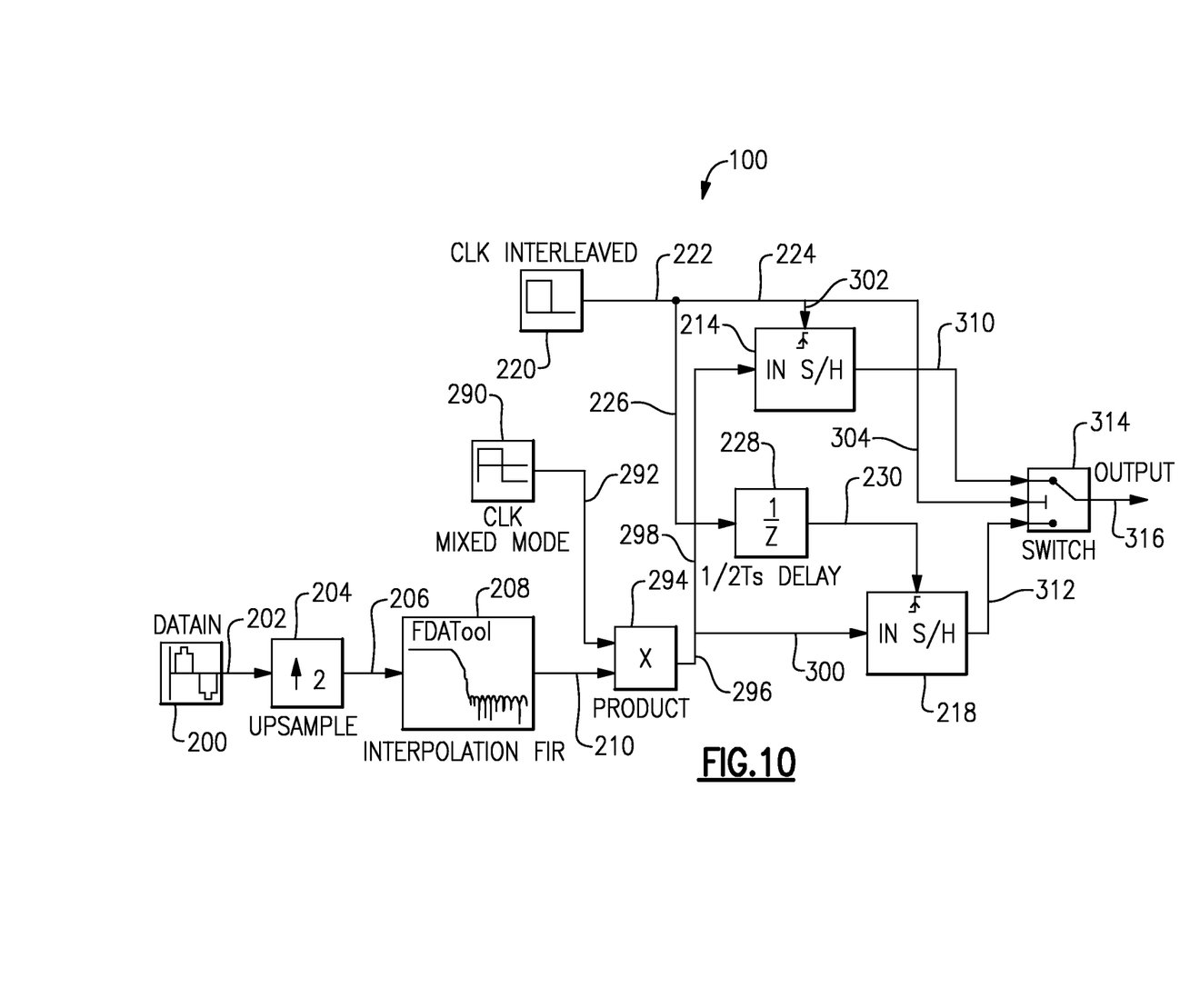
FIG. 10 shows another example DAC configuration that can be implemented to provide desirable features similar to FIGS. 8 and 9.

FIG. 10 shows another example DAC configuration 100 that can be implemented to provide desirable features similar to those described in reference to FIGS. 8 and 9. In the example of FIG. 10, mixing operation can occur in digital domain.

The DAC configuration 100 can include an upsample circuit 204 (e.g., upsample by a factor of 2) that receives an input of digital signal 200 through a path 202 so as to yield an upsampled data. Such data can be provided to a filter 208 (e.g., a finite impulse response (FIR) filter) through a path 206 to yield an upsampled and filtered data in an output path 210.

In the example configuration 100 of FIG. 10, mixing operation can be performed in the digital domain. For example, the digital data (path 210) can be multiplied with a mixed mode clock signal from a clock 290. More particularly, the upsampled and filtered data in path 210 and the clock signal in the path 292 are shown to be provided to a multiplier circuit 294. The multiplier circuit 294 is shown to output a product signal to path 296.

The mixed digital data from the multiplier circuit 294 is shown to be provided to a first S/H circuit 214 through paths 296 and 298. Similarly, the mixed digital data is shown to be provided to a second S/H circuit 218 through paths 296 and 300. The first and second S/H circuits 214, 218 can be operated in a TIDAC mode. For example, the first S/H circuit 214 is shown to be operated by a clock signal from a clock 220 through paths 222, 224 and 302, and the second S/H circuit 218 is shown to be operated by a delayed (e.g., by half-cycle) version of the clock signal from the clock 220 through paths 222, 226 and 230. In the example, the delay is shown to be introduced by a component 228.

In the example shown in FIG. 10, the analog outputs of the first and second S/H circuits 214, 218 are shown to be provided to a switch circuit 314 through paths 310 and 312, respectively. The switch circuit 314 is shown to also receive the interleaving clock signal from the clock 220, through paths 222, 224 and 304. The switch circuit 314 can be operated so as to toggle the output (in path 316) between the two interleaved channels associated with the first and second S/H circuits 214, 218.

In some embodiments, the switching circuit 314 can be implemented as a very high frequency switch. In some embodiments, such a switch can be implemented so as to yield high linearity performance.

Figure 11:
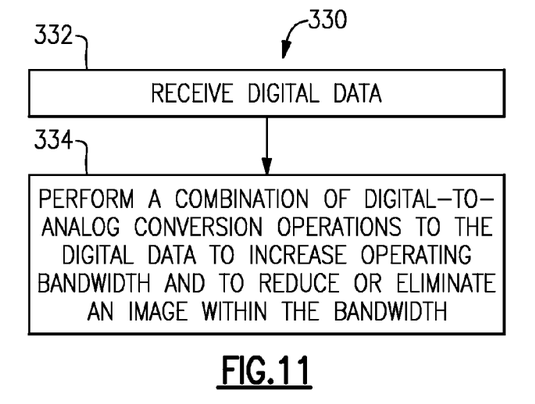
FIG. 11 shows a process that can be implemented to perform a DAC operation as described herein.
Figure 12:
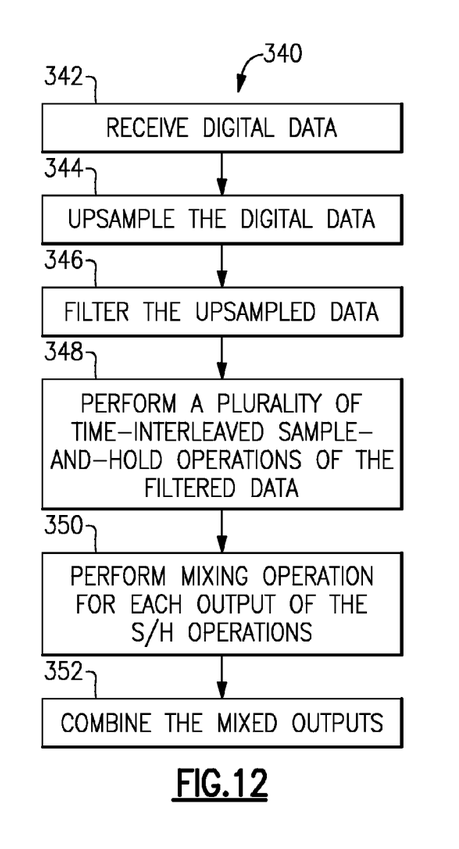
FIG. 12 shows a process that can be a more specific example of the process FIG. 11 in the context of the DAC system of FIG. 8.

FIG. 11 shows a process 330 that can be implemented to perform a DAC operation having one or more features as described herein. In block 332, digital data can be received. In block 334, a combination of DAC operations can be performed to the digital data to increase operating bandwidth and to reduce or eliminate an image within the bandwidth.

In the context of the example DAC systems of FIGS. 8 and 10, FIGS. 12 and 13 show processes 340 and 360, respectively, that can be implemented as more specific examples of the process 330 of FIG. 11. In block 342 of the example process 340 of FIG. 12, digital data can be received. In block 344, the digital data can be upsampled. In block 346, the upsampled digital data can be filtered. In block 348, a plurality of time-interleaved sample-and-hold operations can be performed. In block 350, mixing operation can be performed for each analog output of the time-interleaved S/H operations. In block 352, the mixed analog outputs can be combined to yield an analog output.

Figure 13:
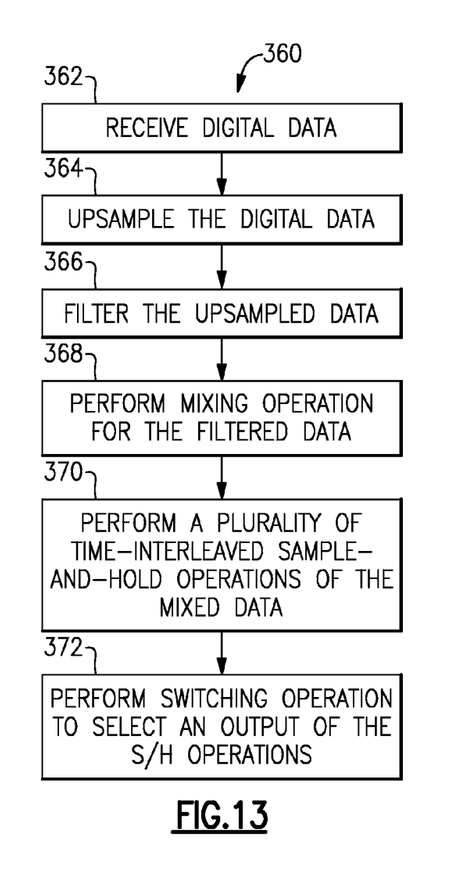
FIG. 13 shows a process that can be a more specific example of the process FIG. 11 in the context of the DAC system of FIG. 10.

In block 362 of the example process 360 of FIG. 13, digital data can be received. In block 364, the digital data can be upsampled. In block 366, the upsampled digital data can be filtered. In block 368, mixing operation can be performed on the upsampled and filtered digital data. In block 370, a plurality of time-interleaved sample-and-hold operations can be performed on the mixed digital data. In block 372, switching operation can be performed to select an output of the S/H operations to yield an analog output.

As described herein, one or more features as described herein can be implemented in wireless systems and/or devices. For example, an infrastructure base station can include a wireless system having one or more features as described herein.

In some implementations, a DAC system having one or more features described herein can be included in an RF device such as a wireless device. Such a device and/or a circuit can be implemented directly in the wireless device, in one or more modular forms, or in some combination thereof. In some embodiments, such a wireless device can include, for example, a cellular phone, a smart-phone, a hand-held wireless device with or without phone functionality, a wireless tablet, etc.

Figure 14:
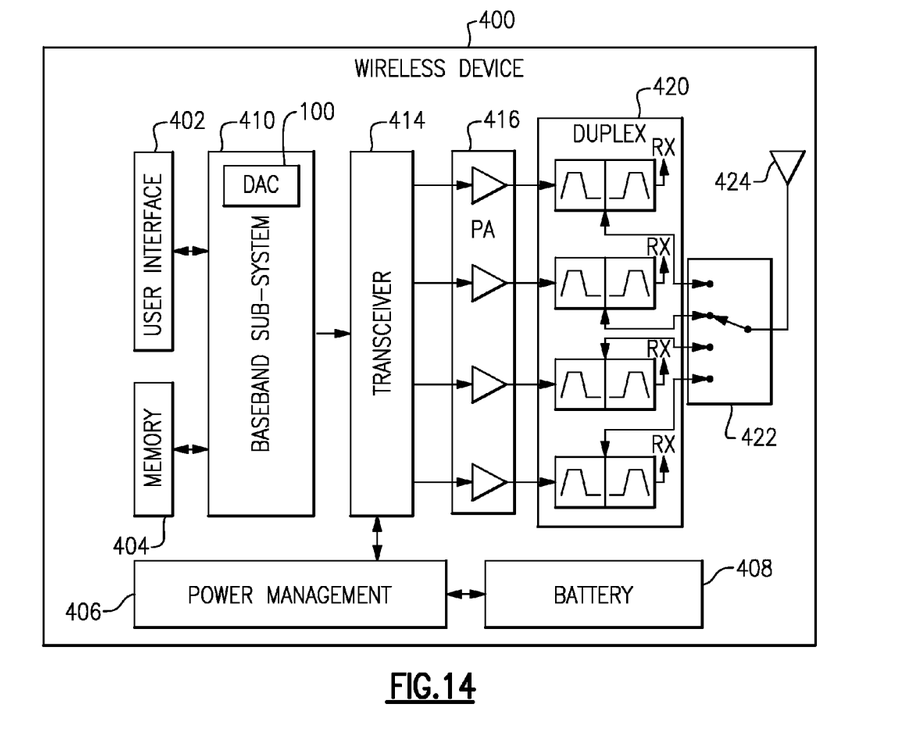
FIG. 14 depicts an example of a radio-frequency (RF) system having one or more DACs as described herein implemented in a wireless device.

FIG. 14 depicts an example wireless device 400 having one or more advantageous features described herein. In the context of a DAC 100 having one or more features as described herein, such a circuit or device can be part of, for example, a baseband sub-system 410.

In the example wireless device 400, a transceiver 414 is shown to interact with the baseband sub-system 410 that is configured to, among others, provide conversion between data and/or voice signals suitable for a user and RF signals suitable for the transceiver 414. For transmission, the transceiver 414 can provide an unamplified RF signal to a power amplifier 416 so as to yield an amplified RF signal. The amplified RF signal can be provided to an antenna 424 through, for example, a switch 422 (via a duplexer 420). The transceiver 414 can also be configured to process received signals. Such received signals can be routed to one or more LNAs (not shown) from the antenna 424, through the duplexer 420. The transceiver 414 is also shown to be connected to a power management component 406 that is configured to manage power for the operation of the wireless device 400.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 15:
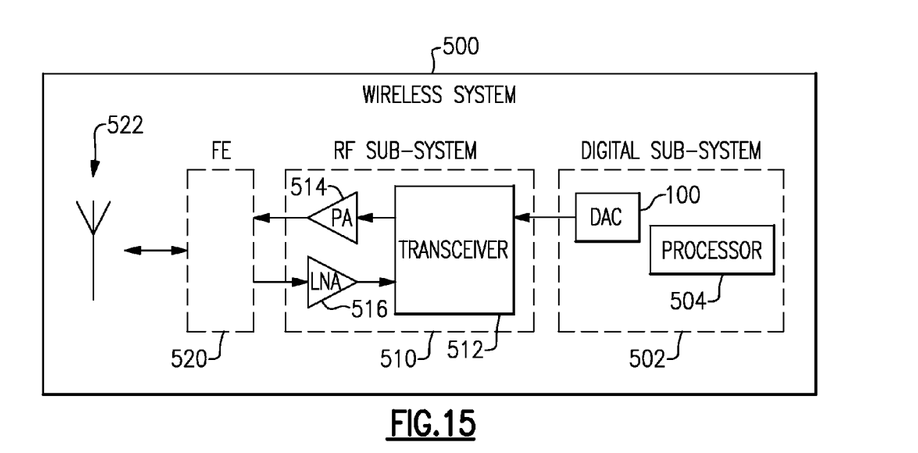
FIG. 15 depicts an example of an RF system having one or more DACs as described herein implemented in a wireless system such as a base station.

In some implementations, a DAC system having one or more features described herein can be included in wireless systems such as those associated with infrastructure base stations. FIG. 15 schematically depicts an example wireless system 500 having one or more advantageous features described herein. In the context of a DAC 100 having one or more features as described herein, such a circuit or device can be part of, for example, a digital sub-system 502. The digital sub-system 502 can be configured to provide one or more functionalities associated with a baseband sub-system. The digital sub-system 502 can also include a processor 504 configured to control and/or facilitate the various functionalities of the digital sub-system 502.

In the example wireless system 500, a transceiver 512 of an RF sub-system 510 is shown to interact with the digital sub-system 502. The digital sub-system 502 can be configured to, among others, provide conversion between data and/or voice signals suitable for a user and RF signals suitable for the transceiver 512. For transmission, the transceiver 512 can provide an unamplified RF signal to a power amplifier 514 so as to yield an amplified RF signal. The amplified RF signal can be provided to an antenna 522 through, for example, a front-end (FE) system 520. The transceiver 512 can also be configured to process received signals. A received signal can be routed to a low-noise amplifier (LNA) 516 from the antenna 520, through the front-end system 520. A number of other components can be included in the wireless system 500 to facilitate its operation.

Various examples are described herein in the context of digital signals being converted into analog RF signals. As is generally understood, an RF sub-system can process such analog signals for transmission first as intermediate-frequency (IF) signals and then as RF signals. Accordingly, it will be understood that RF signals generated by DACs as described herein can include analog signals having frequencies or ranges of frequencies associated with any portion of wireless devices and/or systems, including those associated with the foregoing IF and RF signals.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A digital-to-analog converter (DAC) comprising:
   a first circuit configured to perform a first operation to yield an increased bandwidth of the DAC, the first circuit including a mixing circuit configured to perform a mix mode operation; and
   a second circuit configured to perform a second operation on a digital signal to yield a converted analog signal, the second circuit further configured to reduce or remove an image within the increased bandwidth, the second circuit including a time-interleaved DAC (TIDAC) circuit in communication with the mixing circuit, the TIDAC circuit including a plurality of sample-and-hold (S/H) circuits, each S/H circuit configured to receive a corresponding portion of the digital signal and generate a corresponding portion of the converted analog signal.

2. The DAC of claim 1 further comprising an upsampling circuit configured to upsample an input signal by a factor of n to generate the digital signal, the quantity n being a real number.

3. The DAC of claim 2 wherein the TIDAC circuit further includes a clock in communication with the plurality of S/H circuits, the clock configured to provide interleaved clock signals to the plurality of S/H circuits.

4. The DAC of claim 3 wherein the TIDAC circuit further includes a delay circuit configured to provide a delay for at least one of the interleaved clock signals.

5. The DAC of claim 2 wherein the mix mode operation is performed in analog domain.

6. The DAC of claim 5 wherein the mixing circuit includes a multiplier circuit in communication with each of the plurality of S/H circuits, each multiplier circuit configured to receive the converted analog signal from its respective S/H circuit and a mixing clock signal, each multiplier circuit further configured to generate a product signal based on the converted analog signal and the mixing clock signal.

7. The DAC of claim 6 further comprising a summing circuit in communication with each of the plurality of multiplier circuits, the summing circuit configured to receive the product signals from their respective multiplier circuits and generate an analog output signal for the DAC.

8. The DAC of claim 2 wherein the mix mode operation is performed in digital domain.

9. The DAC of claim 8 wherein the mixing circuit includes a multiplier circuit in communication with an input of each of the plurality of S/H circuits, the multiplier circuit configured to receive the upsampled digital signal and a mixing clock signal, the multiplier circuit further configured to generate a product signal for the plurality of S/H circuits based on the upsampled digital signal and the mixing clock signal.

10. The DAC of claim 9 further comprising a switching circuit in communication with an output of each of the plurality of S/H circuits, the switching circuit configured to receive the converted analog signal from each of the plurality of S/H circuits and a clock signal, the switching circuit further configured to generate an analog output signal for the DAC circuit.

11. The DAC of claim 10 wherein the clock signal provided to the switching circuit is provided from the clock of the TIDAC that provides the interleaved clock signals to the plurality of S/H circuits.

12. A method for converting a digital signal to an analog signal, the method comprising:

performing a first operation to yield an increased bandwidth of the RF signal, the first operation including a mix mode operation; and performing a second operation on the digital signal to yield the analog signal, the second operation further reducing or removing an image within the increased bandwidth, the second operation including a time-interleaved digital-to-analog conversion (TIDAC) operation, the TIDAC operation including a plurality of sample-and-hold (S/H) operations, each S/H operation includes receiving a corresponding portion of the digital signal and generating a corresponding portion of the analog signal.

13. The method of claim 12 further comprising upsampling an input signal to generate the digital signal.

14. The method of claim 13 wherein the mix mode operation is performed in digital domain or in analog domain.

15. The method of claim 14 further comprising combining, or selecting one of, outputs of the TIDAC operations.

16. A baseband sub-system comprising:

a processor configured to generate a digital signal; and a digital-to-analog converter (DAC) configured to convert the digital signal into a radio-frequency (RF) signal, the DAC including a first circuit configured to perform a first operation to yield an increased bandwidth of the DAC, the first circuit including a mixing circuit configured to perform a mix mode operation, the DAC further including a second circuit configured to perform a second operation on the digital signal to yield the RF signal representative of the digital signal, the second circuit further configured to reduce or remove an image within the increased bandwidth, the second circuit including a time-interleaved DAC (TIDAC) circuit in communication with the mixing circuit, the TIDAC circuit including a plurality of sample-and-hold (S/H) circuits, each S/H circuit configured to receive a corresponding portion of the digital signal and generate a corresponding portion of the RF signal.

* * * * *